United States Patent [19]
Roohparvar

[11] Patent Number: 5,774,401
[45] Date of Patent: Jun. 30, 1998

[54] DATA INPUT/OUTPUT CIRCUIT FOR PERFORMING HIGH SPEED MEMORY DATA READ OPERATION

[75] Inventor: Frankie F. Roohparvar, Cupertino, Calif.

[73] Assignee: Micron Technology, Inc., Boise, Id.

[21] Appl. No.: 833,315

[22] Filed: Apr. 4, 1997

Related U.S. Application Data

[62] Division of Ser. No. 499,025, Jul. 6, 1995, Pat. No. 5,663,908.

[51] Int. Cl.[6] .................................................. G11C 13/00
[52] U.S. Cl. ............................ 365/189.02; 365/189.01; 365/189.03; 365/189.05; 365/205
[58] Field of Search ........................ 365/189.01, 189.02, 365/189.03, 189.05, 205

[56] References Cited

U.S. PATENT DOCUMENTS

| | | | |
|---|---|---|---|
| 4,041,333 | 8/1977 | Porat | 307/279 |
| 5,043,945 | 8/1991 | Bader | 365/190 |
| 5,220,532 | 6/1993 | Kertis | 365/190 |
| 5,663,908 | 9/1997 | Roohparvar | 365/189.01 |
| 5,663,922 | 9/1997 | Tailliet | 365/240 |

*Primary Examiner*—Viet Q. Nguyen
*Attorney, Agent, or Firm*—Schwegman, Lundberg, Woessner & Kluth, P.A.

[57] ABSTRACT

A data input/output circuit used to program the cells of a memory array or to determine the state of those cells. The circuit includes a data write path used for programming the memory cells in the array and a data read path for reading data indicative of the state of the cells. The data write path includes switching means for electrically disconnecting the high capacitance elements of the write path from the read path. The switching means is under the control of a control means which acts to enable or disable the switching means. The switching means serves to electrically isolate the high capacitance elements of the write path from the read path, thereby increasing the speed with which a read operation be performed.

4 Claims, 2 Drawing Sheets

DATA INPUT/OUTPUT CIRCUIT FOR PERFORMING HIGH SPEED MEMORY DATA READ OPERATION

This application is a division of application Ser. No. 08/499,025, filed Jul. 6, 1995, now U.S. Pat. No. 5,663,908.

TECHNICAL FIELD

The present invention relates to apparatus for programming and reading memory devices, and more specifically, to a data input/output circuit which increases the speed with which a read operation can be performed on a memory cell.

BACKGROUND OF THE INVENTION

FIG. 1 is a block diagram of a prior art data input/output circuit 1 for programming memory cells of a non-volatile memory array (such as a flash memory array), and for reading data indicative of the state of those cells. As shown in FIG. 1, an input/output pad 10 is connected to circuit elements which form a data read path 30 and a data write path 32 to a memory array (not shown). Pad 10 is part of the metallization of the integrated circuit containing the memory array and is connected by means of a wire bond to a data pin of the integrated circuit package. There is one data input/output circuit 1 associated with each data input/output line of the memory, with there typically being eight or sixteen data input/output lines depending upon the memory architecture.

Read path 30 and write path 32 are electrically connected to data line 34, which connects those paths to the memory array by means of decoding multiplexer 16. Decoding multiplexer 16 functions to connect read path 30 and write path 32 to a selected one of the plurality of bit lines of the array, where one of the bit lines is represented by line 19. The selected bit line, which is determined by an address provided to the memory, is connected to the drain of the memory cell being read or programmed.

Write path 32 includes a data latch 12 for storing data input by means of pad 10. Latch 12 is activated or enabled by latch enable signal 13. The latched data is then sent to data input buffer 14, which produces the voltage on line 21 which is applied to the bit line of the cell to be programmed. Input buffer 14 is typically implemented in the form of a tri-statable driver having an output which can be placed in a high impedance mode and effectively disabled during a read operation. The disabling of input buffer 14 is achieved by means of tri-state control line 15. Note that even though control line 15 can be used to disable input buffer 14, buffer 14 remains electrically connected to line 21 in this situation. Thus, any capacitance elements contained in buffer 14 remain electrically connected to line 21 even when buffer 14 is disabled. In some implementations, the functions of latch 12 and input buffer 14 may be combined into a single device.

As noted, input buffer 14 is involved in generating and applying the voltage to the bit line of the target cell which is used for programming that cell. Programming a memory cell typically requires that a relatively precise positive voltage and a relatively large amount of current be delivered to the drain of the cell. Input buffer 14 functions to generate this precise voltage at the required current level. This is typically accomplished by generating a precise voltage and placing this voltage on the gate of an output transistor of input buffer 14. The output transistor is usually an N-channel device which has its source connected to line 21 and is in a source-follower configuration.

In order to precisely control the voltage output by buffer 14 on line 21, it is desirable to maintain the gate-to-source voltage $V_{gs}$ of the output transistor as close to the threshold voltage $V_{th}$ as possible. As is well known, for an N-channel MOS device operating in the saturation region, the drain to source current, $I_{ds}$, is given by:

$$I_{ds} = \frac{\beta}{2}(V_{gs} - V_{th})^2,$$

where $\beta$ is the MOS transistor gain factor, and $V_{th}$ is the threshold voltage of the device. The gain factor $\beta$ is dependent upon both the fabrication process parameters and the device geometry, with the geometry dependence being given by (W/L), where W is the channel width and L is the channel length of the transistor.

As is evident from the relationship for $I_{ds}$, with $(V_{gs}-V_{th})$ small, $\beta$ must be large in order to produce a large current. This is usually accomplished by making (W/L) large, that is, the device itself is made physically larger. For example, in order to provide the 500 microamp current typically required for programming each memory cell in a flash memory array, a device having a width of approximately 1000 microns is required.

However, an undesirable result of the device having a large value of (W/L) is that the junction capacitance, which is proportional to the transistor width W, is also large. As noted, this large capacitance remains electrically connected to line 21 even when the output of input buffer 14 is switched to the high impedance state by the control signal on line 15. Thus, a result of input buffer 14 being designed to generate the precise voltage and high current needed for the programming function is that a large capacitance is also placed in the data write 32 (programming) path. In addition, because data write path 32 and data read path 30 are electrically connected by virtue of their common connection to data line 34, this capacitance is also electrically connected to the read path.

As previously noted, decoding multiplexer 16 is used to access a desired memory cell in the array for purposes of reading data from or writing data to that cell. Thus, when it is desired to program a particular memory cell, multiplexer 16 is used to access the specified cell and input pad 10, latch 12, and input buffer 14 are used as the data path to program that cell by means of data line 34.

When reading a memory cell of the array, multiplexer 16 is again used to access the bit line connected to the selected memory cell in the array. In the event the cell being read is in an erased state, the cell will typically conduct a current which is converted to a voltage on line 19. Sense amplifier 18 determines the state of the cell, i.e., whether it is programmed or erased (corresponding to a binary value of 0 or 1, respectively). This determination is based on comparing the voltage on lines 19 and 34 to a reference voltage. The outcome of this comparison between the two input voltages is an output which is either high or low, corresponding to a digital value of one or zero. The output of sense amplifier 18 is sent to output buffer 20 which drives the data to output pad 10 where it is accessed by a user.

The minimum time required to perform consecutive read operations is primarily determined by the time it takes for the input voltage indicative of a programmed or erased cell state to stabilize to a value which can be unambiguously compared to the reference voltage input to sense amplifier 18. Thus, the input voltage must either converge to and remain at a value greater than the reference voltage, or converge to and remain at a value less than the reference voltage. This amount of time, dt, is related to the capacitance of the circuit path along which the voltage is set up, which includes lines 19, 34 and 21. As is known, this relationship is given by:

$$dt = C(\Delta V/I),$$

where C is the capacitance of the circuit, $\Delta V$ is the magnitude of the voltage swing required to go from the present voltage on line 34 (the reference voltage) to that needed to have the output of sense amplifier 18 switch, and I is the current driven along the circuit. Thus, as the capacitance of the circuit is increased, the time required to stabilize the input to the sense amplifier increases.

As the flash memory cells in the array are primarily subjected to reading operations rather than programming operations, the time required for a read operation is very important in determining the overall performance of the memory. However, as has been described, implementing a circuit capable of providing the desired conditions for an efficient programming operation has the effect of placing a large capacitance in the data read path 30. This results in an increase in the minimum read operation time of the device.

Another factor which increases the read operation time arises because the decoding multiplexer 16 must be capable of coupling the relatively high voltages originating from input buffer 14 in programming operations. Such multiplexers typically include N-channel pass transistors which require gate drive voltages in excess of the programming voltage provided by the input buffer 14. Since the programming voltage is almost always larger than the primary supply voltage, the gate drive voltage must be generated by a special circuit, such as a charge pump circuit, to produce a drive voltage which is greater than the primary supply voltage. This requires a level shifting from the primary supply level to the pumped or higher voltage level. This constraint acts to increase the time delay in the path for decoding multiplexer 16 during read operations. In addition, the transistors of decoding multiplexer 16 have to conduct the relatively large currents used for programming and must be a large geometry device, which further adds to the capacitance present in the read path.

What is desired is a data input/output circuit for use in programming and reading a memory array in which the read operation time is not limited by the capacitance of the elements used to program the array. The present invention addresses this problem by providing a relatively precise programming voltage at the necessary current level without significantly adding to the capacitance of the data read line. In addition, the multiplexer used in read operations does not require a large drive voltage and have the inherent time delay in switching between voltage levels. These and other advantages of the present invention will be apparent to those skilled in the art upon a reading of the following Detailed Description of the Invention together with the drawings.

SUMMARY OF THE INVENTION

The present invention is directed to a data input/output circuit used to program the cells of a memory array or to determine the state of those cells. The circuit includes a data write path used for programming the memory cells in the array and a data read path for reading data indicative of the state of the cells. The data write path includes switching means for electrically disconnecting the high capacitance elements of the write path from the read path. The switching means is under the control of a control means which acts to enable or disable the switching means. The switching means serves to electrically isolate the high capacitance elements of the write path from the read path, thereby increasing the speed with which a read operation can be performed.

Further objects and advantages of the present invention will become apparent from the following detailed description and accompanying drawings.

DETAILED DESCRIPTION OF THE INVENTION

Figure 2:
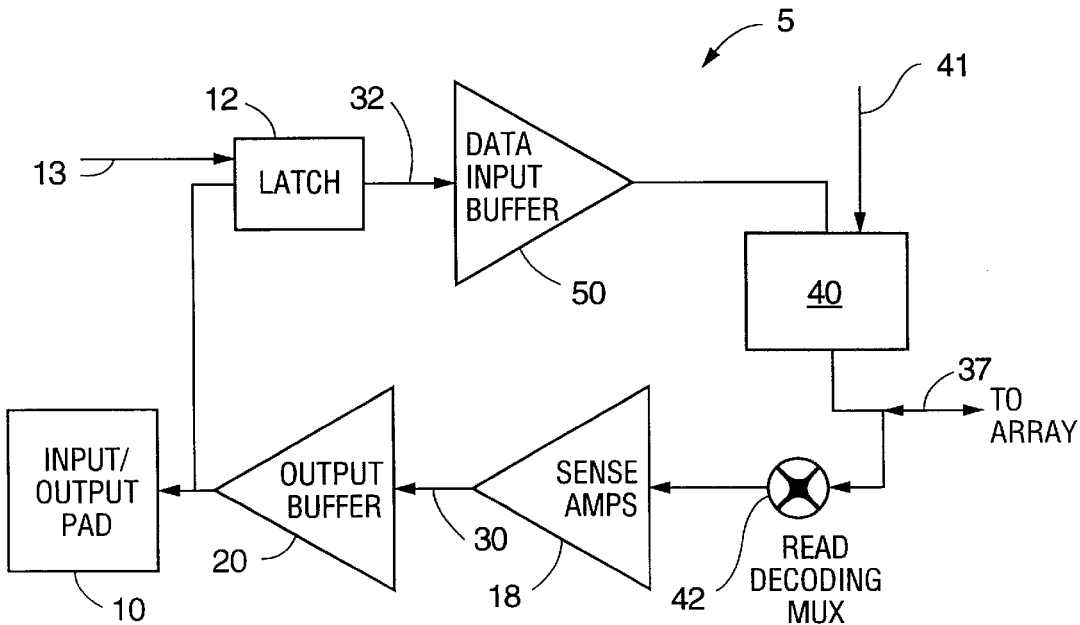
FIG. 2 is a block diagram of the data input/output circuit of the present invention used for programming memory cells of a memory array and for reading data indicative of the state of those cells.

Referring again to the drawings, FIG. 2 is a block diagram of a data input/output circuit 5 of the present invention which is used for programming memory cells of a memory array and for reading data indicative of the state of those cells. The data input/output circuit of FIG. 2 is intended to be used to access flash memory cells contained in an array, however, the present invention is not limited to such a use and is applicable to other types of memory systems as well.

Figure 1:
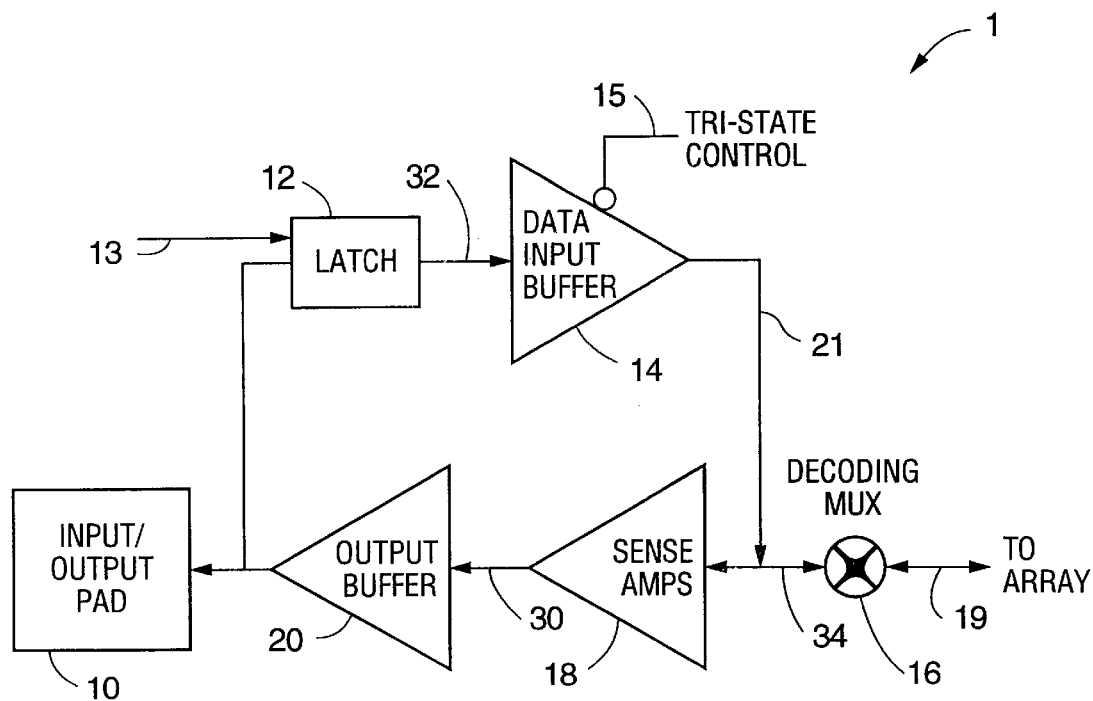
FIG. 1 is a block diagram of a prior art data input/output circuit for programming memory cells of a memory array and for reading data indicative of the state of those cells.

As described with respect to FIG. 1, an input/output pad 10 of FIG. 2 is connected to circuit elements which form a data read path 30 and a data write path 32 to a memory array (not shown). Read path 30 and write path 32 are electrically connected to line 37, which is used to connect those paths to the memory array. Line 37 is typically connected to a multiplexer (not shown) which is connected at its other side to the bit lines of the memory array.

The components of write path 32 include a data latch 12 for storing data input by means of pad 10. Latch 12 is activated or enabled by latch enable signal 13. The latched data is sent to data input buffer 50, which produces the voltage and current conditions required for programming a memory cell in the array.

In accordance with the present invention, write path 32 contains read path/write path decoupler 40 which is used to electrically decouple (disconnect) write path 32 from read path 30. This serves to electrically isolate the high capacitance elements of write path 32 (such as those contained in data input buffer 50) from read path 30.

Decoupler 40 is preferably implemented as a write operation multiplexer and functions to connect the output of input buffer 50 to a selected bit line of the plurality of array bit lines by means of the multiplexer connected to line 37. The decoupler control signal on line 41 is generated based on the address presented to the memory and on whether the memory system is in a read mode or a program mode of operation. As indicated in FIG. 2, there are separate multiplexers for the reading and programming (writing) operations.

When reading the data contained in a memory cell of the array which is indicative of the state of that cell, read multiplexer 42 is used in conjunction with the multiplexer connected to line 37 to access a selected bit line of the array. The voltage indicative of the programmed state of the cell being read is connected to data read path 30 by read multiplexer 42 and conducted along that path, which includes sense amplifier 18. As previously described, sense amplifier 18 determines the state of the cell, i.e., whether it is programmed or erased (corresponding to a binary value of 0 or 1, respectively). The output of sense amplifier 18 is sent to output buffer 20 which drives the data to output pad 10 where it is accessed by a user.

Figure 3:
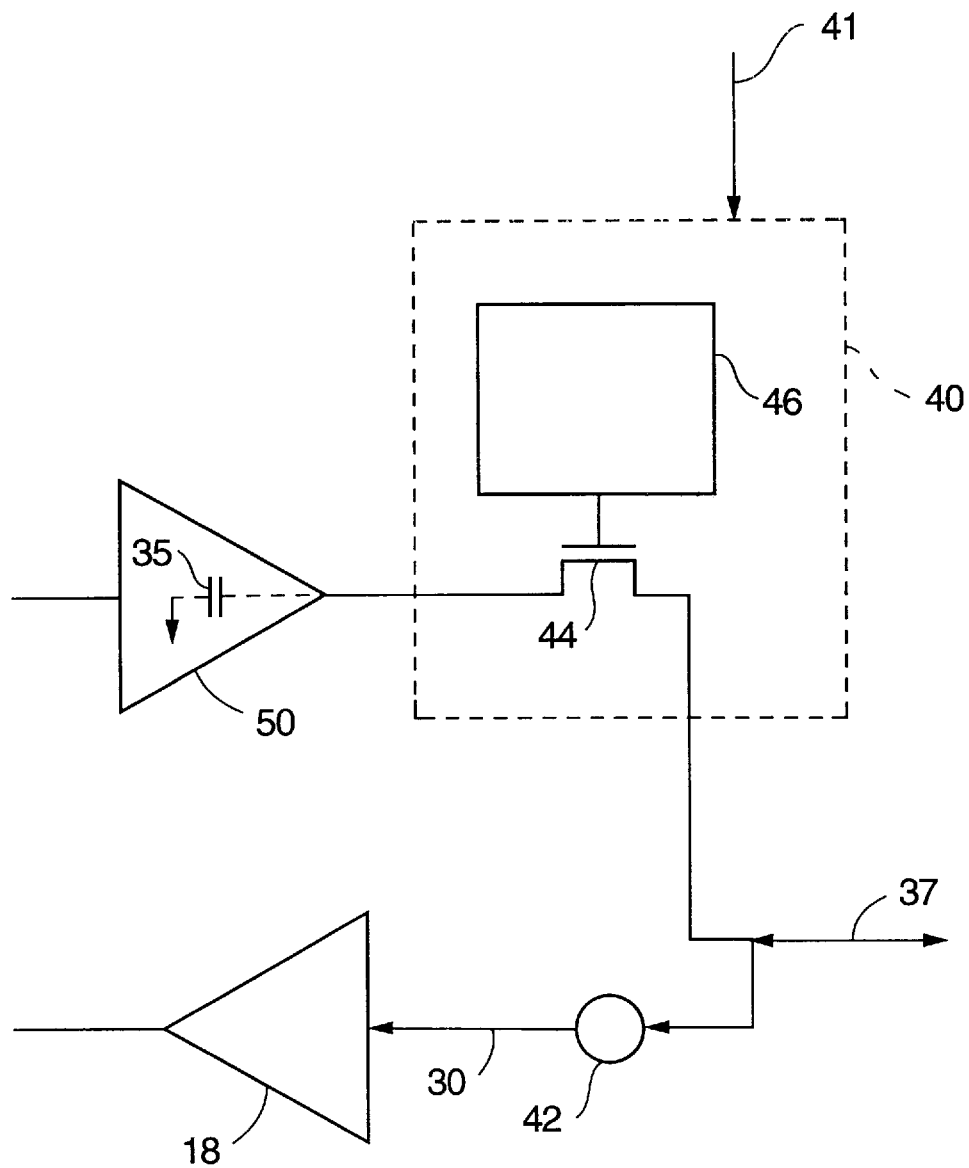
FIG. 3 is a block diagram of a portion of the circuit of FIG. 2, showing the read path/write path decoupler of the present invention in greater detail.

FIG. 3 is a block diagram of a portion of the data input/output circuit 5 of FIG. 2, showing the read path/write path decoupler (program multiplexer) 40 of the present invention in greater detail. Decoupler 40 includes a controller 46 which receives control signal 41 as an input. In response to control signal 41, controller 46 acts to either enable or disable the action of switching means 44, which in FIG. 3 is shown as a transistor having its gate contact connected to controller 46. A separate switching means or transistor 44 is used for each I/O pad 10 or pin of the array. Only the switching means connected to the selected I/O pad is enabled during a programming operation.

Switching means 44 serves as a pass device which responds to controller 46 by either electrically connecting data input buffer 50 to line 37, or electrically disconnecting input buffer 50 from line 37 when carrying out a read operation or other non-programming operation. As indicated by the presence of capacitance 35 of input buffer 50, when decoupler 40 acts to electrically disconnect input buffer 50 from line 37, capacitance element(s) 35 are electrically disconnected from data read path 30. This means that the high capacitance element(s) of input buffer 50 no longer affect the speed with which a read operation can be performed.

Input buffer 50 must still be capable of precisely generating the programming voltage at a relatively high current which is needed to program a memory cell contained in the array. However, because transistor 44 is acting as a pass device, the gate to source voltage, $V_{gs}$, of transistor 44 is not critical. Thus, $V_{gs}$ can be increased to a large value (greater than that of input buffer 50) to ensure that the drain to source voltage drop across the device is small, and this can be achieved without affecting the magnitude of the programming voltage produced by input buffer 50. Thus, transistor 44 can have a much smaller value of (W/L) and still couple the precise programming voltage to the elements of the array at the necessary current level.

The lower value of (W/L) for transistor 44 results in that device having a much smaller capacitance value than do the elements of data input buffer 14 of FIG. 1, and that of the output transistor of input buffer 50. This means that when decoupler 40 disconnects input buffer 50 from the bit lines during read operations, only the relatively low capacitance value of transistor 44 is electrically connected to read path 30 rather than the large capacitance of input buffer 50. Thus, the time required for performing memory read operations is substantially reduced.

The use of decoupler 40 eliminates the requirement that the input buffer be capable of tristate operation. Note that data input buffer 50 of FIG. 3 still performs the voltage and current generating functions required for programming the array. However, because decoupler 40 is not required to perform those programming functions, its physical size and capacitance value can be reduced significantly. All decoupler 40 must do is act to pass the voltage and current generated by input buffer 50 during the programming operation. The result is to have a lower capacitance and physically smaller (on the order of 50 microns wide) device electrically connected to data read path 30, instead of the higher capacitance element(s) of input buffer 50 which would otherwise be electrically connected to the read path.

For example, for the case of a device 1000 microns wide and having a $(V_{gs}-V_{th})$ value of 1 volt when acting as a source follower, its current driving capability is proportional to $1000 * (1)^2$. In contrast, by operating transistor 44 such that $(V_{gs}-V_{th})$ equals 5 volts, its current driving capability is proportional to $W/L * (5)^2$. Thus, transistor 44 can have a size equal to 1/25 of the size of the 1000 micron device and still pass the same amount of current.

As noted, decoupler 40 provides a means for electrically disconnecting capacitance element(s) 35 of input buffer 50 from data read path 30. As decoupler 40 has a lower capacitance value than input buffer 50, this produces a data input/output circuit 5 which is capable of performing consecutive read operations faster than a typical data input/output circuit in which the input buffer (and its associated higher capacitance) are electrically connected to the data read path.

In the preferred embodiment, decoupler 40 includes an N-channel device, however, other embodiments which perform the same function can also be used. A P-channel device can be used, as well as other types of switching devices which act to decouple the capacitance element(s) 35 of input buffer 50 from data read path 30.

A further advantage of the present invention derives from the fact that device 40 functions as a program decoder. Thus, read multiplexer 42 need not have the capability of coupling the high voltages and current used for programming a memory cell, so that smaller and lower capacitance pass transistors can be used in comparison to those used in multiplexer 16 of FIG. 1. In addition, the large magnitude drive voltages required for multiplexer 16 are not required. Thus, since voltage level shifting is not required, there are fewer gate delays occurring when selecting a desired bit line using read multiplexer 42. This also reduces the access time for performing read operations.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. An input/output data circuit for use in an integrated circuit memory system having an array of memory cells and at least one contact pad for providing an electrical interface between the memory system and an operating environment, with the contact pad functioning to both receive data to be programmed into the memory and to provide data read from the memory, said data circuit comprising:

a data read path extending between the contact pad and the array of memory cells, the data read path including sense amplifier means for determining a programmed state of a selected cell of the array; and a data program path extending between the contact pad and the array of memory cells, the data program path including (1) programming means for applying a programming voltage to a selected cell of the array; and (2) disconnect means for electrically disconnecting an output of the programming means from the read data path when not performing a programming operation on the cell of the array.

2. The input/output data circuit of claim 1, wherein the memory array includes a plurality of bit lines connected to the memory cells, and further, wherein the disconnect means further functions to couple the output of the programming means to a selected bit line when the memory is performing a programming operation.

3. The input/output data circuit of claim 2, wherein the data read path includes read multiplexer means for coupling a selected bit line to the sense amplifier means when the memory system is performing a read operation.

4. The input/output data circuit of claim 3, wherein the read multiplexer means operates at a voltage level which is lower than the programming voltage level.

* * * * *